United States Patent [15] 3,663,836

Fernandez-Sein [45] May 16, 1972

[54] PHASE SHIFTER FOR ULTRAHIGH FREQUENCIES

[72] Inventor: Rafael Fernandez-Sein, San German, P.R.

[73] Assignee: Westinghouse Electric Corporation, Pittsburgh, Pa.

[22] Filed: June 9, 1970

[21] Appl. No.: 45,103

[52] U.S. Cl. ..............................307/262, 307/295, 307/320

[51] Int. Cl. ..........................................................H03k 1/12

[58] Field of Search .................307/262, 295, 320; 331/36 C, 331/177 V; 332/30 V

[56] References Cited

UNITED STATES PATENTS 3,527,964 9/1970 Hansen et al. ........................307/262

*Primary Examiner*—Roy Lake
*Assistant Examiner*—James B. Mullins
*Attorney*—F. H. Henson and E. P. Klippel

[57] ABSTRACT

A circuit is described for obtaining a controllable phase shift with very little amplitude variation at ultrahigh frequencies, the circuit being entirely solid state and readily integrated. This is achieved by a shunt-series feedback pair of transistors wherein the output of a first transistor is applied through a second emitter follower transistor and a feedback path to the base of the first transistor, together with a variable capacitance diode connected in shunt with the collector-base junction of the first transistor.

5 Claims, 1 Drawing Figure

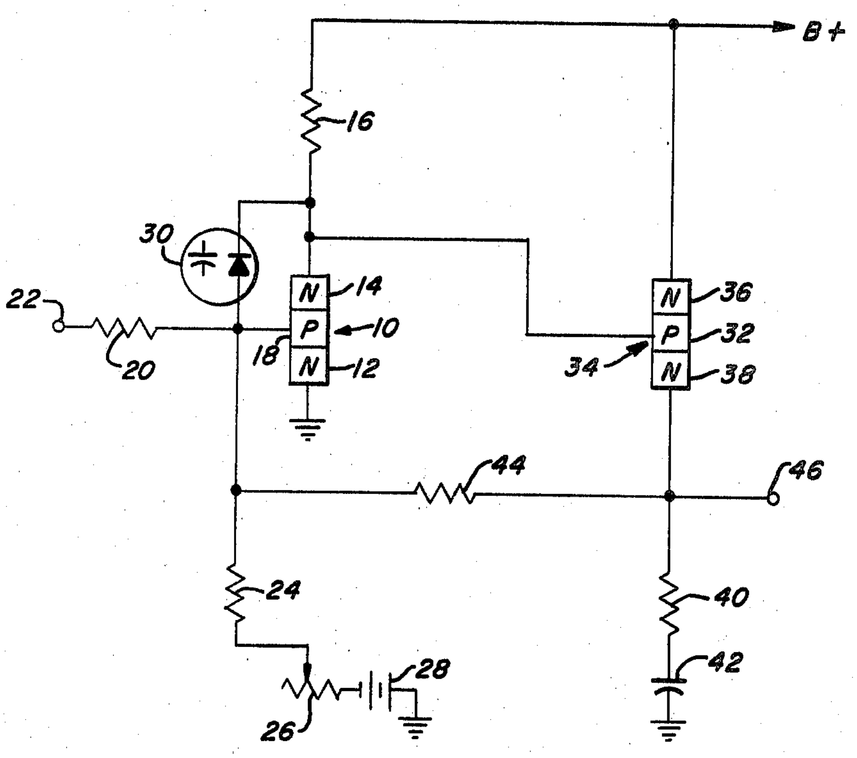
INVENTOR
RAFAEL FERNANDEZ-SEIN
By Ernest P. Klipfel
Attorney

PHASE SHIFTER FOR ULTRAHIGH FREQUENCIES

BACKGROUND OF THE INVENTION

As is known, phase shifting techniques in common use at low frequencies are very difficult to apply in the vicinity of 100 megahertz. As a result, designers have relied on extensions of microwave techniques which employ couplers, isolators or magnetic devices. Such circuit elements, however, are relatively bulky and not readily compatible with integrated circuit techniques.

SUMMARY OF THE INVENTION

As an overall object, the present invention seeks to provide a phase shifter for ultrahigh frequency signals which is entirely solid state and readily adapted for fabrication as an integrated circuit.

More specifically, an object of the invention is to provide a phase shifter of the type described comprising a pair of transistors connected in a shunt-series feedback pair arrangement, together with a variable capacitance diode connected between the collector and base of the first transistor of the pair.

In accordance with the invention, a phase shifter is provided including first and second transistors, the collectors of the transistors being connected to a source of driving potential while their emitters are connected to a point of reference potential. A feedback path connects the emitter of the second transistor to the base of the first transistor; while a variable source of potential is connected between the base and emitter of the first transistor. This variable source of potential is lowered to a point where the transistor is very near cut off, but still linear in operation. By providing means for causing the collector-to-base capacitance of the first transistor to decrease as the transconductance of this same transistor increases as a result of a decrease of the variable potential source, the phase of the output signal can be made to vary with only a small amplitude variation.

The above and other objects and features of the invention will become apparent from the following detailed description taken in connected with the accompanying single FIGURE drawing which schematically illustrates one embodiment of the invention.

With reference now to the drawing, the circuit shown includes a first NPN transistor 10 having its emitter 12 connected to ground and its collector 14 connected to a source of positive driving potential, B+, through resistor 16. The base 18 of transistor 10 is connected through resistor 20 to an input terminal 22 to which input signals are applied, and is also connected through resistor 24 and potentiometer 26 to the negative terminal of a battery 28 having its positive terminal grounded. In shunt with the base-collector junction of the transistor 10 is a variable capacitance diode, generally indicated at 30.

The collector 14 of transistor 10 is connected to the base 32 of a second NPN transistor 34. The collector 36 of the transistor 34 is connected directly to the source of positive potential, B+, while its emitter 38 is connected through resistor 40 and capacitor 42 to ground. The emitter 38 of transistor 34 is also connected through a feedback path including resistor 44 to the base 18 of transistor 10. Output signals appear on terminal 46 at the emitter 38 of the transistor 34. With the arrangement shown, the signals on the emitter of transistor 34 are fed back to the base of transistor 10 in negative feedback fashion.

In the operation of the phase shifter, the potentiometer 26 is adjusted such that the voltage on the base 18 becomes more and more negative, thereby tending to cut off the transistor 10, which is conducting. In this process the voltage on the collector 14 of transistor 10 rises in the positive direction. The potentiometer 26 is adjusted until the voltage on the base 18 is just above cut off. At this point, transistor 10 is still linear, in the sense that a 1 db change in the input results in a 1 db change in the output. Thereafter, small variations in the negative potential applied to the base of transistor 10 will cause a phase shift in the output voltage appearing at terminal 46 with respect to the input voltage applied to terminal 22 with no appreciable change in output amplitude. This effect can be explained by the fact that the voltage dependent collector-to-base capacitance of the variable capacitance diode 30 decreases with an increase in collector voltage of transistor 10; while the current dependent transconductance of transistor 10 decreases at approximately the same rate, thus keeping the gain of transistor 10 constant as the phase of the input signal is varied.

A circuit which has been found to operate in accordance with the foregoing explanation has the following circuit constants:

| | |
|---|---|
| transistors **10** and **34** | –2N2857 |
| diode **30** | –1N5140 |
| resistor **20** | –51 ohms |
| resistor **24** | –1300 ohms |
| resistor **16** | –2000 ohms |
| resistor **44** | –510 ohms |
| resistor **40** | –51 ohms |
| capacitor **42** | –560 picofarads |

A circuit utilizing the foregoing constants has achieved phase shifts of ±6° with a swing of 1.5 volts about a nominal voltage at the junction of resistor 24 and potentiometer 26 of 17.6 volts, and with an amplitude variation of less than 0.1 db over the whole range. Phase shifts of ±18°, with an amplitude variation of less than 1 db have also been obtained.

Higher powered models of this device have been constructed using a 2N3866 transistor. This type of transistor exhibits a very large collector-to-base capacitance variation, thus obviating the use of an outboard variable capacitance diode. In this manner, an overall gain can be expected of the device, at the expense of reduced range and freedom from amplitude variation.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. A phase shifter comprising a first transistor having an emitter, a collector and a base, a second transistor having an emitter, a collector and a base, means connecting the collectors of said transistors to a source of driving potential, means connecting the emitters of said transistors to a point of reference potential, a connection between the collector of said first transistor and the base of said second transistor, a connection between the emitter of said second transistor and the base of said first transistor, a variable source of potential connected between the base and emitter of said first transistor, and means including said variable source of potential for causing the collector-to-base capacitance of said first transistor to decrease as the transconductance of said first transistor increases whereby variation in said variable source of potential will cause the phase of the signal on the collector of said first transistor to vary with essentially no variation in amplitude of the signal at said collector.

2. The phase shifter of claim 1 wherein said means for causing the collector-to-base capacitance of said first transistor to decrease as the transconductance of said first transistor increases comprises a variable capacitance diode connected between the base and collector of said first transistor.

3. The phase shifter of claim 1 wherein said variable source of potential is varied about a nominal value which is just above the cut off potential of said first transistor.

4. The phase shifter of claim 1 wherein said transistors are of the NPN type and said source of variable potential is negative as applied to the base of said first transistor.

5. The phase shifter of claim 1 wherein the emitter of said second transistor is connected to said point of reference potential through a resistor and a capacitor.

* * * * *